United States Patent
Kim et al.

[11] Patent Number: 5,993,301
[45] Date of Patent: Nov. 30, 1999

[54] APPARATUS TO CLEAN GOLDEN PLATES

[75] Inventors: Woo-sig Kim; Choul-su Kim; Masaharu Tsukue, all of Kyungki-do, Rep. of Korea

[73] Assignee: SamSung Electronics Co., Ltd., Kyungki-do, Rep. of Korea

[21] Appl. No.: 08/881,566

[22] Filed: Jun. 24, 1997

[30] Foreign Application Priority Data

Jun. 24, 1996 [KR] Rep. of Korea ...................... 96/23292

[51] Int. Cl.6 .............................. B24B 7/00; B24B 25/00; B24B 5/00
[52] U.S. Cl. ........................... 451/190; 451/312; 451/555
[58] Field of Search .................................... 451/320, 313, 451/314, 555, 190, 312; 15/210.1, 160, 88.1, 88.2, 102, 77

[56] References Cited

U.S. PATENT DOCUMENTS

| | | | |
|---|---|---|---|
| 2,654,109 | 10/1953 | Barnes | ................................. 15/104.92 |
| 3,948,736 | 4/1976 | Russell . | |
| 4,350,654 | 9/1982 | Yoshida . | |
| 4,447,286 | 5/1984 | Weglin . | |
| 4,696,129 | 9/1987 | Roberts | ................................. 451/555 |
| 4,748,773 | 6/1988 | Dawson et al. . | |
| 4,895,033 | 1/1990 | Voss et al. . | |
| 5,092,782 | 3/1992 | Beaman . | |
| 5,148,595 | 9/1992 | Doggett et al. . | |
| 5,190,486 | 3/1993 | Tsuk . | |
| 5,341,980 | 8/1994 | Nishikawa et al. . | |
| 5,461,747 | 10/1995 | Clausen et al. | ...................... 15/104.94 |
| 5,505,656 | 4/1996 | Moore | ..................................... 451/540 |
| 5,548,890 | 8/1996 | Tada et al. . | |
| 5,604,018 | 2/1997 | Horiuchi et al. . | |

*Primary Examiner*—David A. Scherbel
*Assistant Examiner*—Philip J. Hoffmann
*Attorney, Agent, or Firm*—Robert E. Bushnell, Esq.

[57] ABSTRACT

An apparatus to clean gold plated contact surfaces on printed circuit boards uses a printed circuit board guide and cleaning units in contact with the printed circuit board guide. A guide rail on the printed circuit board guide is adapted to guide the printed circuit board having contaminated gold plated contact surfaces. The cleaning units include grindstones to abrade the gold plated contact surfaces and rub off the contaminants. Embodiments are capable of achieving cleaning uniformity, reducing failure rate, and enhancing the quality of the products. The effectiveness of the invention permits operators to carry out other operations during the cleaning process. Practice of the present invention also provides improved operating conditions without problems such as those due to the presence of waste eraser particles.

12 Claims, 8 Drawing Sheets

APPARATUS TO CLEAN GOLDEN PLATES

CLAIM OF PRIORITY

This application makes reference to, incorporates the same herein, and claims all benefits accruing under 35 U.S.C. §119 from an application for APPARATUS TO CLEAN GOLDEN PLATES earlier filed in the Korean Industrial Property Office on Jun. 24, 1996 and there duly assigned Ser. No. 23292/1996.

BACKGROUND OF THE INVENTION

1. Field of the Invention

The present invention relates generally to an apparatus and process for cleaning gold plated contact surfaces of printed circuit boards and, more particularly, to an apparatus and process for removing contaminants from gold plated contact surfaces by using a grindstone in contact with the gold plated contact surfaces.

2. Description of the Prior Art

Typically, on printed circuit boards various components (e.g. resistors, capacitors, inductors, integrated circuits and the like) are mounted and soldered. The components are electrically connected to each other to function via pre-patterned copper wiring traces formed on the surfaces of printed circuit boards. Surface mounting technology components and printed board assembly components are mounted upon printed circuit board assemblies. After the surface mount technology components are mounted and soldered on the surface of the printed circuit board, the printed board assembly components are inserted through the holes on the printed circuit board and the assembly is introduced into a soldering machine. Flux is applied to the printed circuit board in a flux bath, the board is preheated in a heater, the solder ports of the printed circuit board are soldered, and the printed circuit board is then cooled upon completion of the soldering.

Printed circuit boards serve as main boards or as expansion boards in electronic appliances such as personal computers. Usually, the expansion boards are adapted for expanding the functions of the personal computers and have gold plated contact surfaces that enable the board to be inserted into the slots on a main board and while forming electrical connections allowing the functionally extended boards to communicate via signals exchanged with the main board. These gold plated contact surfaces are contaminated by the flux applied however, and the residue and other dirt stain the gold plated contact surfaces due to oxidized gas generated during soldering. Such contaminants on the gold plated contact surfaces exhibit poor electrical connection with the slots and connectors.

Other efforts that used grinding of circuit boards included the Biased Grinding Assembly of T. F. Dawson, et alii, U.S. Pat. No. 4,748,773, and the Sample Holder For Use In The Grinding Or Polishing Of Samples of J. T. Voss, et alii, U.S. Pat. No. 4,895,033. Other processes such as the Selectively Plating Electrically Conductive Pin by Peter Tsuk, U.S. Pat. No. 5,190,486, seek to avoid leading residue or contaminants on gold plated contact regions by the expedient of a partially cured, aqueous stripping system. Relatively recent efforts such as the shot blasting technique of Nobuhiko Tada, et alii, found in U.S. Pat. No. 5,548,890 entitled Lead Frame Processing Method, eject minute particulates that collide with the circuit board; this technique relies upon the kinetic energy of the particulates to remove spatters and dross deposited during manufacture of the circuit board.

Customarily, the gold plated contact surfaces formed on a circuit board are manually erased with an eraser after the soldering process to remove the various contaminants; however the contaminants caused by the oxidized gas can be erased with an eraser while the flux can not be removed effectively in the same manner and the presence of the human operator diminishes production efficiency. Moreover, it is hard to uniformly remove the contaminants and the operating conditions become worse due to the creation of waste particles from the eraser.

SUMMARY OF THE INVENTION

Accordingly it is an object of the present invention to provide an improved apparatus and process for forming gold electrical contact surfaces on printed circuit board assemblies.

It is another object to provide an apparatus and process for effectively removing contaminants from gold plated contact surfaces of printed circuit boards while reducing the failure rate of products bearing gold plated contacts.

These and other objects may be achieved in the practice of the present invention with a grindstone adapted to contact the gold plated contact surfaces formed on a printed circuit board. Each printed circuit board bearing contaminated gold plated contact surfaces is loaded onto a guide rail of a circuit board guide. Movement of the printed circuit board along the guide rail enable the grindstone to grind and remove the contaminants from the gold plated contact surfaces.

The features, object of the present invention will be apparent from the following description of a preferred embodiment thereof and from the accompanying drawings.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIG. 6b is a plan view of an embodiment of the present invention having two of the apparatus of FIG. 6a;

DETAILED DESCRIPTION OF THE INVENTION

Figure 1A:
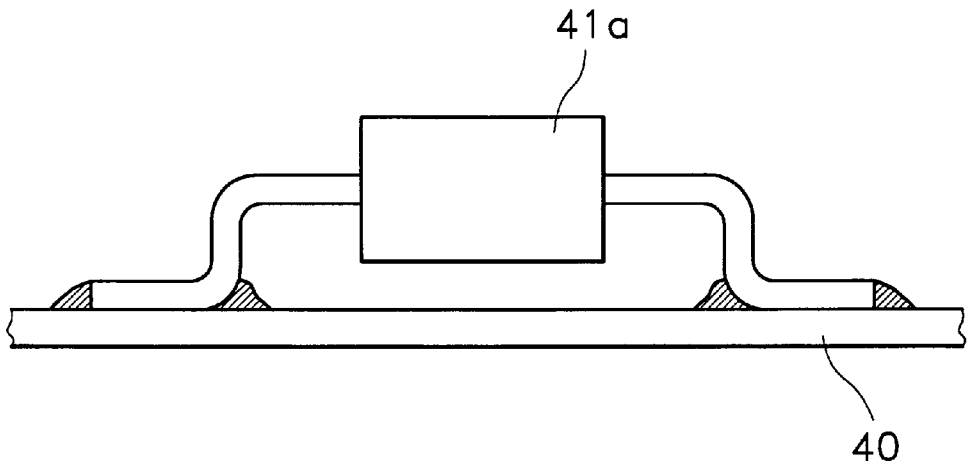
FIG. 1A is an elevational cross-sectional view showing a typical surface mount technology component mounted on a printed circuit board.
Figure 1B:
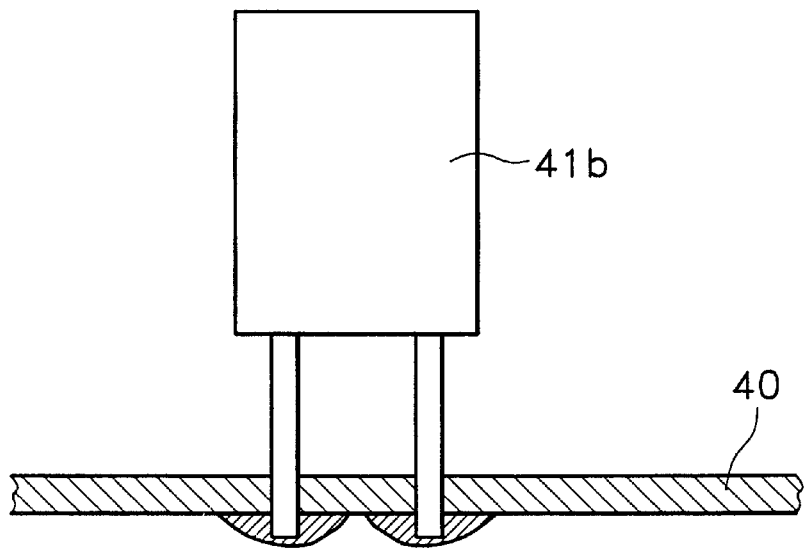
FIG. 1B is an elevational cross-sectional view showing a typical board assembly component mounted on a printed circuit board.

Typically, various active and passive electrical components (e.g. resistors, capacitors, inductors, integrated circuits and the like) are mounted and soldered on printed circuit boards. The components are electrically connected to each other to function via pre-patterned copper wiring traces formed on the printed circuit boards. Classically, there are two kinds of components mounted on printed circuit boards. One is surface mounting technology (SMT) components 41a shown in FIG. 1A, and the other is printed board assembly (PBA) components 41b shown in FIG. 1B. After surface mounting technology components are mounted and soldered on the surface of a printed circuit board 40, the printed board assembly components are inserted through the holes on the printed circuit board 40 and the printed circuit board 40, now bearing the printed board assembly components that have been inserted, is introduced into a soldering machine for soldering of those components.

Figure 2:
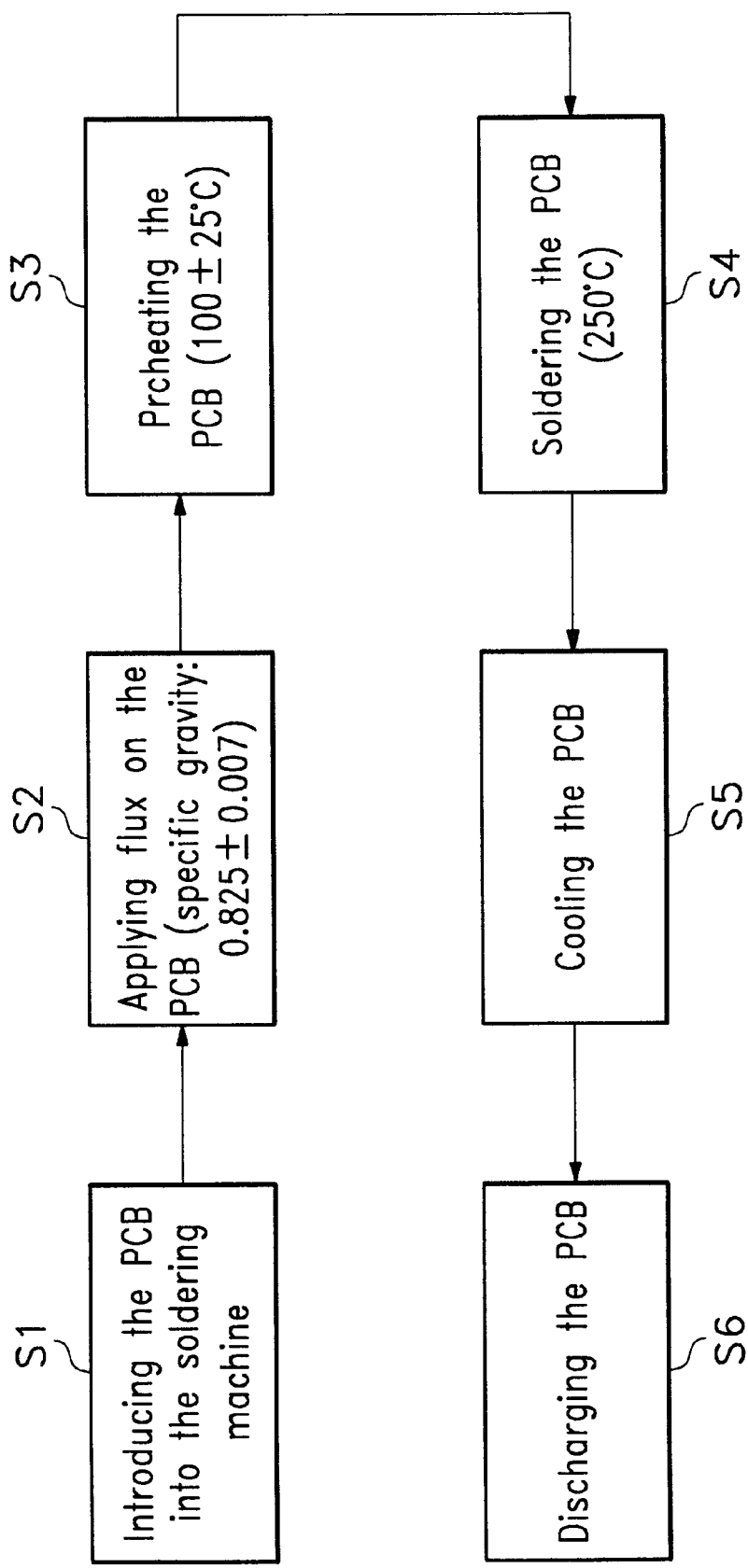
FIG. 2 is a flowchart diagram describing the salient steps found in a hypothetical conventional soldering process for printed circuit boards.
Figure 3A:
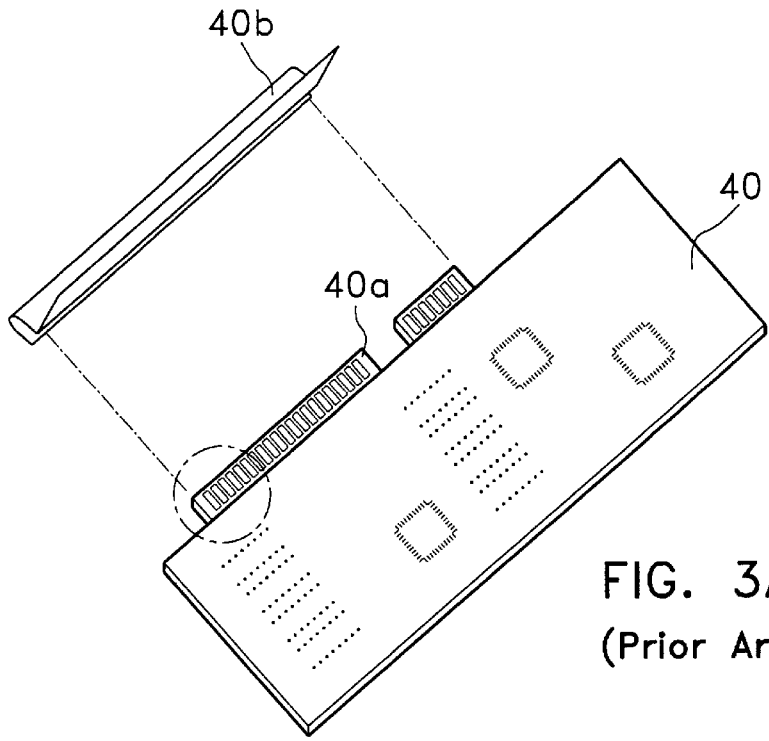
FIG. 3A is a perspective view showing a guide adapted to fit over the gold plated contact surfaces of printed circuit boards.

FIG. 2 is a flowchart diagram showing salient features of a hypothetical typical soldering process for a printed circuit board bearing inserted printed board assembly components. The soldering process follows the steps of introducing the printed circuit board into the soldering machine during step SI, applying flux on the printed circuit board in a flux bath during step S2, preheating the printed circuit board in a heater during step S3, soldering the solder ports of the printed circuit board during step S4, cooling the printed circuit board upon completing soldering during step S5, and discharging the printed circuit board during step S6. Printed circuit boards serve as either main boards or as expansion boards in electronic appliances such as personal computers. Usually, the expansion boards are adapted to expand the functions of the personal computer. Such expansion board include gold plated contact surfaces 40a as shown in FIG. 3A, to enable the board to be inserted into the slots of the main board and allow the functional extension board to communicate via electrical signals with the main board. A guide 40b is frequently fitted over the gold plated contact surfaces, in order to avoid contamination of the contract surfaces during soldering process.

Figure 3B:
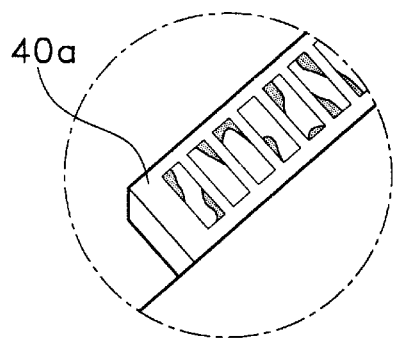
FIG. 3B is an enlarged fragmentary view taken from FIG. 3A, showing gold plated contact surfaces bearing contaminants.

As depicted in FIG. 3B however, the gold plated contact surfaces are frequently contaminated by the flux during the step S2 of applying flux. Flux, other residue and dirt stain the gold plated contact surfaces due to oxidized gas generated during the soldering step S4 in FIG. 2. With such contaminants the gold plated contact surfaces form poor electrical connection with slots and connectors. This results in an overall deterioration of the products.

Figure 4:
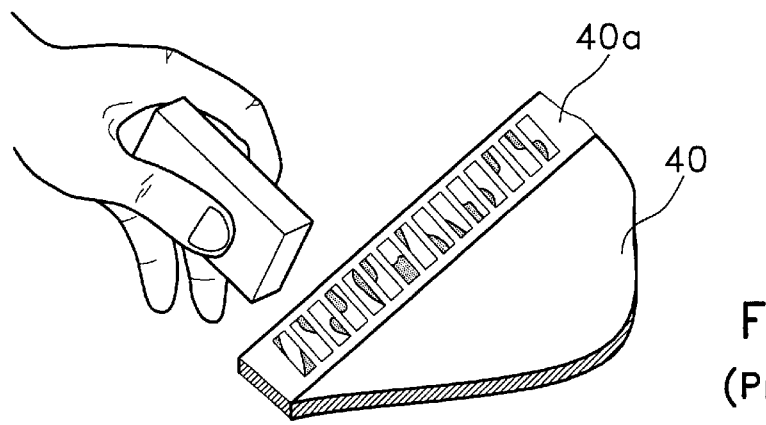
FIG. 4 is a perspective view showing one conventional technique frequently used in an effort to remove the contaminants shown in FIG. 3B.

As represented in FIG. 4, to avoid poor quality of the products caused by deposits of the contaminants on the gold plated contact surfaces, the contact surfaces are customarily manually erased with a hand held eraser after the soldering process, in order to remove the various surface deposits of contaminants. I have noticed however, that the contaminants caused by oxidized gases can not be removed with an eraser, and that the flux can not be effectively removed in this manner. Moreover, this erasing operation is done manually by an operator; consequently the need for the operator reduces manufacturing efficiency. It is hard to uniformly remove the contaminants with an eraser and the waste particles from the eraser adversely affect the operating conditions during manufacture of the printed circuit board assembly.

Figure 5:
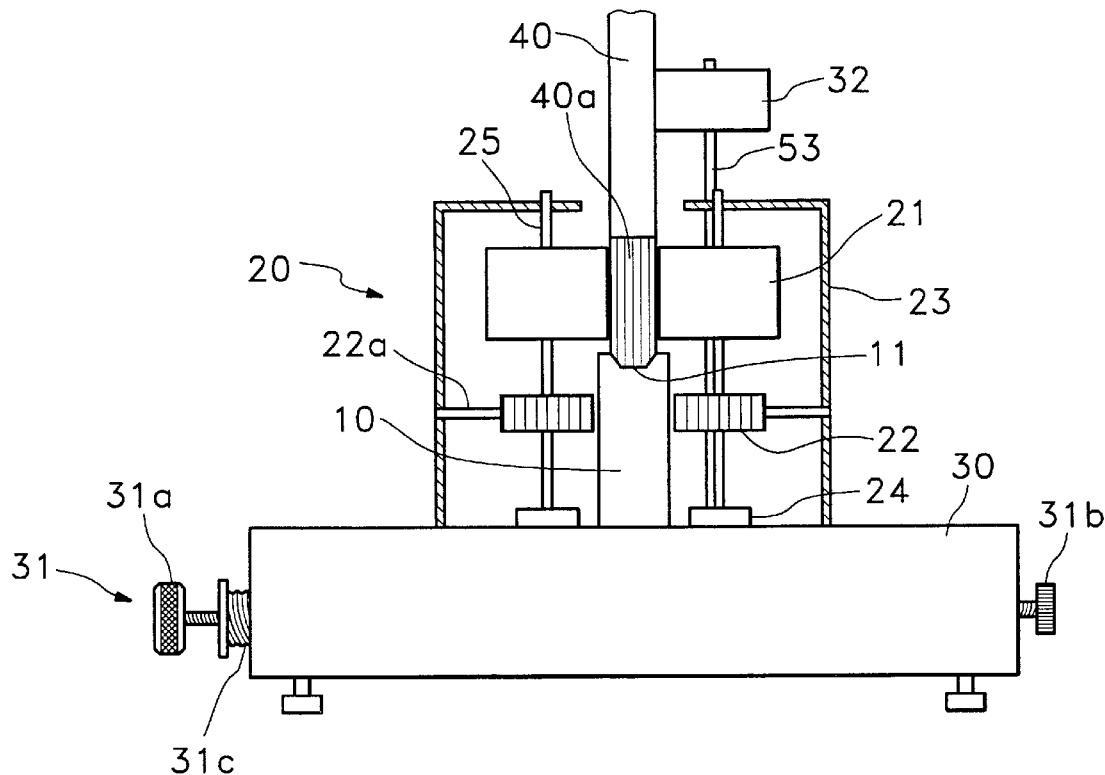
FIG. 5 is a cross sectional elevational view of one embodiment constructed for the practice of the principles of the present invention.
Figure 6A:
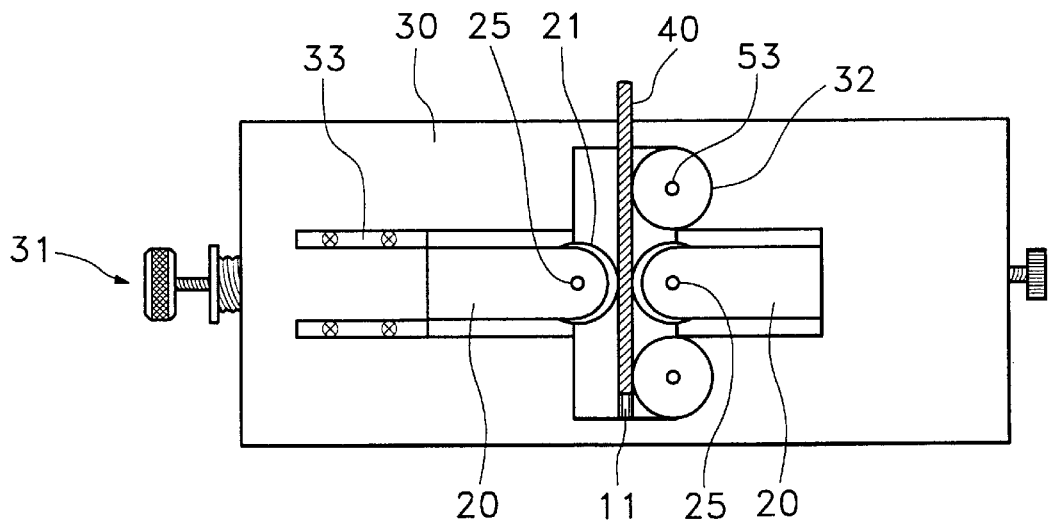
FIG. 6a is a plan view of the apparatus of FIG. 5.
Figure 6B:
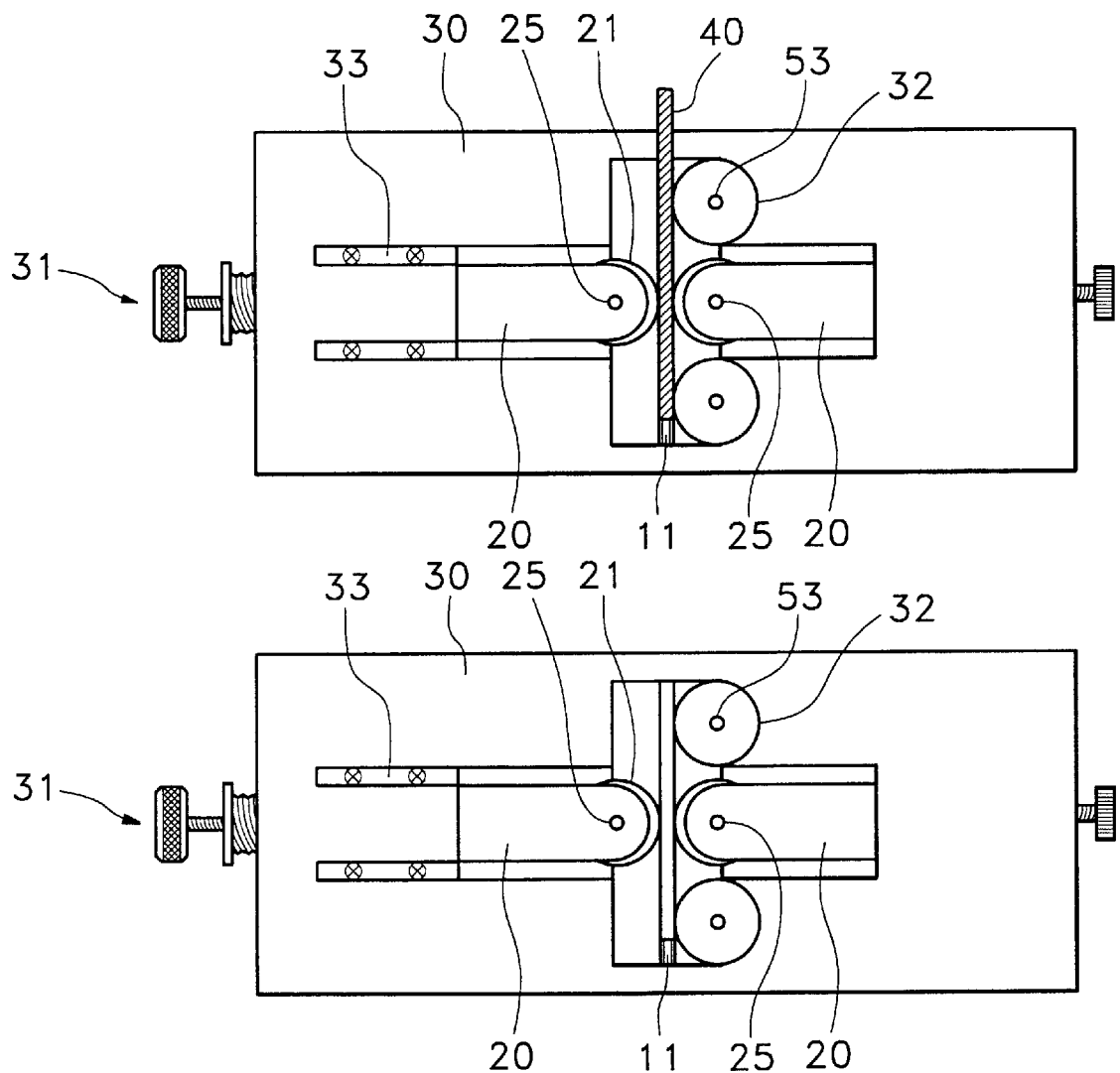

Referring now to FIGS. 5 and 6, the apparatus of the present invention for cleaning gold plated contact surfaces has a printed circuit board guide 10 constructed with a printed circuit board guide rail 11 having stepped sides located to guide a printed circuit board 40 horizontally through the assembly. Cleaning unit 20 is constructed with a circularly shaped grindstone 21 positioned to rub contaminants from gold plated contact surfaces 40a during relative movement between gold plated contact surfaces 40a and grindstone 21 as circuit board 40 travels along the length of guide rail 11. Base 30 supports and fixes cleaning units 20 and printed circuit board guide 10 to stationary positions. A pair of cleaning units 20 may be positioned facing each other on opposite sides of printed circuit board guide 10.

Axles 53 mounted on base 30 support corresponding ones of printed circuit board guide rollers 32 in contact with the printed circuit board to maintain the vertical orientation of printed circuit board 40 on the printed circuit board guide rail 11 relative the horizontal upper surface of base 30, and thereby facilitate the smooth movement of printed circuit board 40 along the length of printed circuit board guide rail 11.

Figure 7:
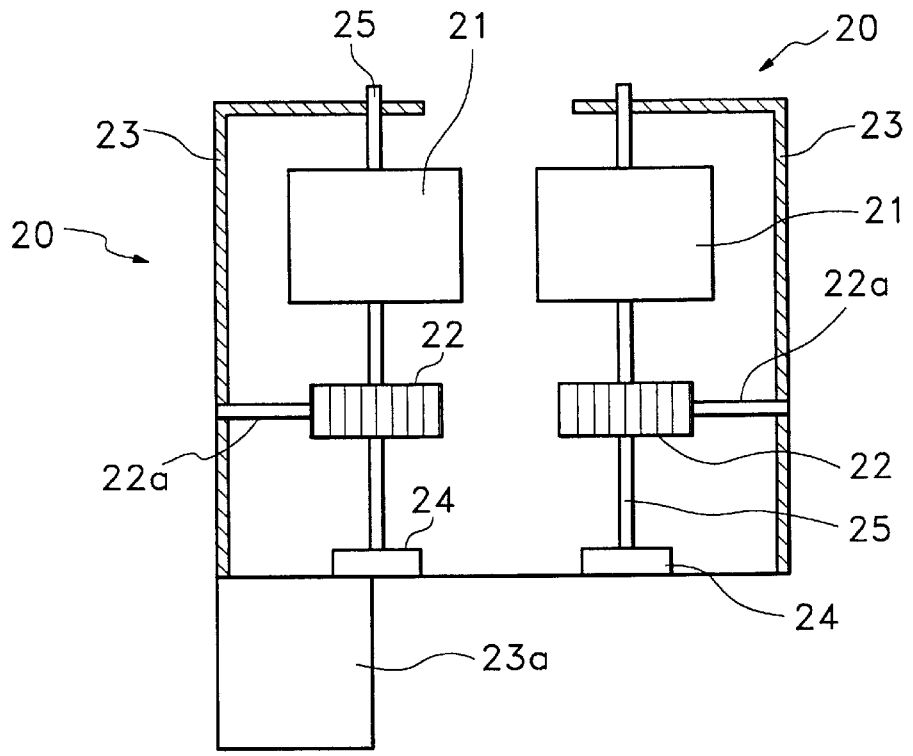
FIG. 7 is a cross sectional view of a cleaning unit included in the apparatus of FIG. 5.
Figure 8:
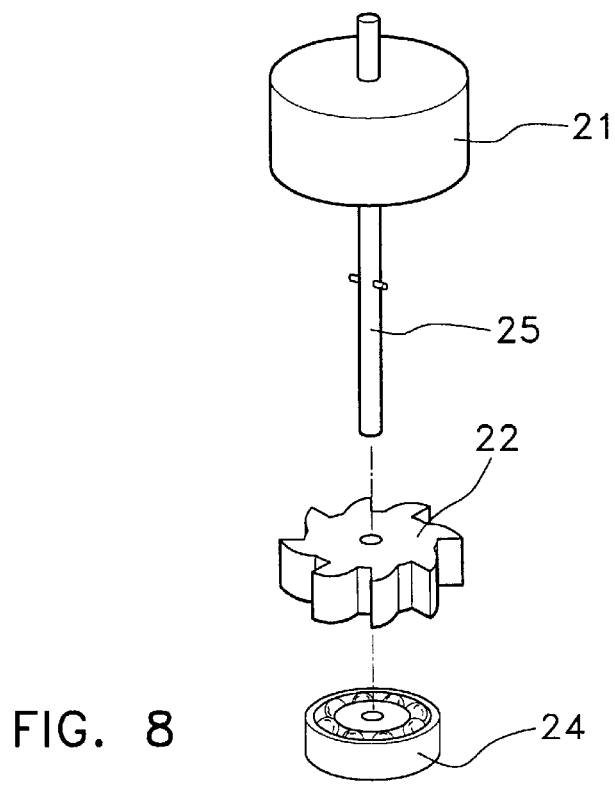
FIG. 8 is an exploded perspective view of one assembly incorporated into the cleaning unit.
Figure 9:
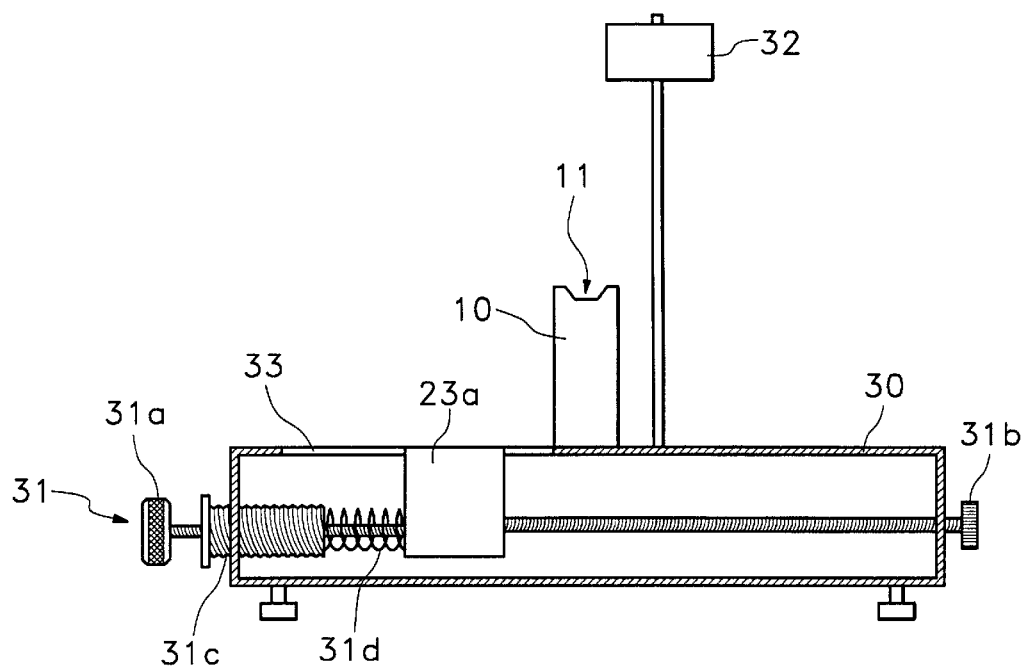
FIG. 9 is a cross sectional elevational view of a base included in the apparatus of FIG. 5.

Turning now to FIGS. 7, 8 and 9, cleaning units 20 each have a cylindrical grindstone 21 to rub off contaminants from gold plated contact surfaces 40a, a shaft 25 extending coaxially through corresponding grindstones 21 in order to position grindstone 21, a ratchet 22 to prevent grindstone 21 from rotating in a reverse direction, and frame 23 supporting shaft 25. A bearing 24 supported by base 30, is located at the bottom of the shaft 25 of the cleaning unit 20, in order to permit cleaning unit 20 to rotate on shaft 25. When a pair of cleaning units 20 are mounted on base 30 facing each other on opposite sides of printed circuit board guide 10, one of cleaning units 20 may have a bracket 23a positioned at the bottom of support frame 23; bracket 23a is inserted into a unit guide rail 33 formed on the base 30. The grindstones 21 are in contact with the gold plated contact surfaces 40a.

Base 30 may be constructed with unit guide rail 33 to guide the bracket 23a of the cleaning unit 20 for reciprocating horizontal travel along base 30 relative to the stationary cleaning unit 20. Space adjuster 31 threadingly engages bracket 23a and adjusts the separation between cleaning units 20 in proportion to the amount of abrasion of the gold contract surfaces by grindstones 21. Bracket 23a is inserted into unit guide rail 33. Space adjuster 31 determines the horizontal separation between cleaning unit 20 and printed circuit board 40 by virtue of driving bracket 23a horizontally along slot 33 and thereby varying the location of the bracket 23a connected to one of support frames 23.

Figure 10:
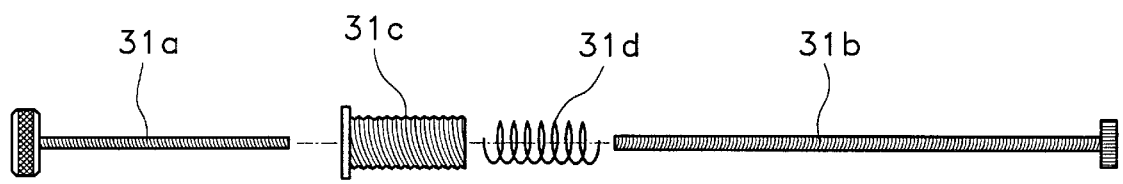
FIG. 10 is a exploded cross sectional view of a space adjuster and a tension adjuster used in the base illustrated by FIG. 10.

FIG. 10 is a exploded cross sectional view of the cooperating space adjuster and a tension adjuster mechanisms. Space adjuster 31 may be constructed with a first space adjustment screw 31a and a second space adjustment screw 31b positioned on opposite ends of base 30. Tension adjustment may be provided by rotation of tension adjustment screw 31c relative to spring 31d. Tension adjustment screw 31c adjusts the force of spring 31d relative to bracket 23a and determines the bias force applied to the pair of grindstones 21 via frames 23 and movable bracket 23a, thereby controlling the degree of force between grindstones 21 and gold plated contact surfaces 40a as circuit board 40 travels along guide rail 11. First space adjustment screw 31a is inserted through, and supported by an end of the base 30. A coaxial through hole perforates tension adjustment screw 31c receives spring 31d. Second space adjustment screw 31b is inserted through the other end of base 30. Spring 31d is inserted into the hollow inner end of tension adjustment screw 31c, and is located between tension adjustment screw 31c and the bracket 23a. Consequently, by either tightening or loosening first and second space adjustment screws 31a, 31b, it is possible to vary, and thereby carefully adjust the separation between cleaning units 20 and printed circuit board 40; it is also possible to limit the range over which bracket 23a of cleaning unit 20 may be move along unit guide rail 33. By adjusting tension adjustment screw 31c, the force created by the compression of spring 31d relative to the bracket 23a may be accurately controlled. Grindstones 21 may be in accurately placed in contact with the gold plated contact surfaces 40a with a fixed pressure, under the controlled force of spring 31d.

Figure 11:
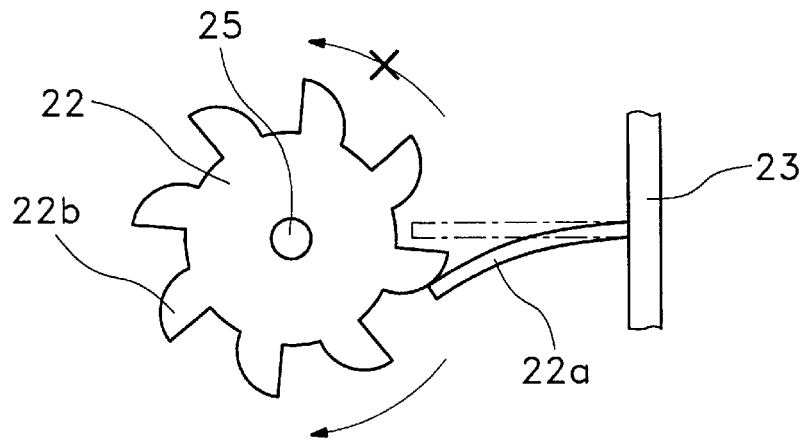
FIG. 11 is a schematic view showing the operation of a ratchet incorporated into the apparatus of FIG. 5 to prevent reverse rotation.

FIGS. 8 and 11 respectively provide an exploded and an operational plan view showing the operation of a ratchet 22 incorporated into one embodiment of the present invention in order to prevent reverse rotation of grindstones 21. Ratchets 22 are coaxially mounted on corresponding shafts 25 to rotate with the rotation of the shaft 25. A detent 22a is positioned between teeth 22b of ratchet 22b so that detent 22a prevents ratchet 22, and shaft 25, from rotating in a reverse direction.

Figure 12:
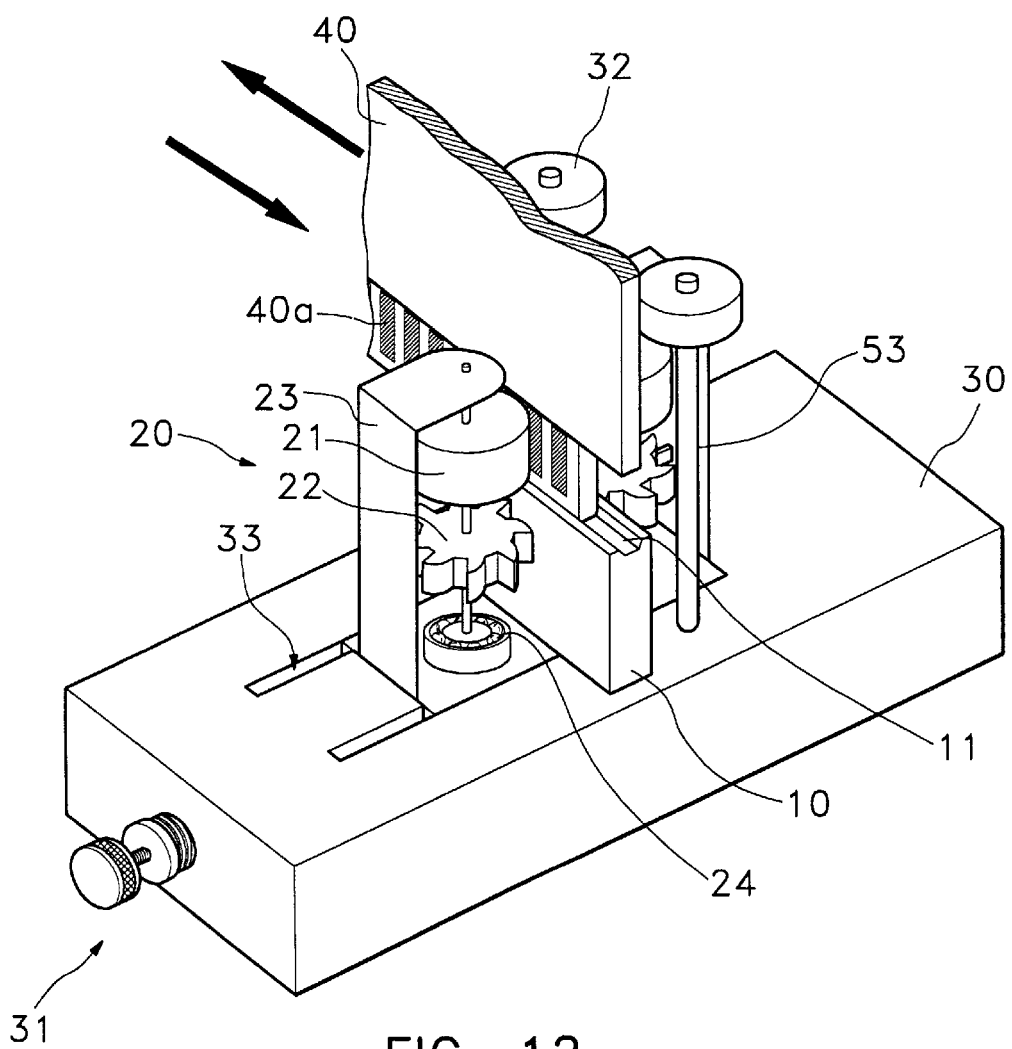
FIG. 12 is a perspective view of the apparatus constructed to clean gold plated contact surfaces according to the principles of the present invention.

FIG. 12 is a perspective view of the apparatus as that apparatus may be constructed in accordance with the principles of the present invention. The construction of the apparatus is as described in the foregoing paragraphs of this specification. The operation of the invention will be described in detail by reference to FIGS. 5 through 12 collectively. A printed circuit board 40 bearing contaminants on the gold plated contact surfaces 40a is introduced onto printed circuit board guide rail 11 of guide 10 and printed circuit board 40 is driven to smoothly slide back and forth along the length of printed circuit board guide rail 11, supported by printed circuit board guide roller 32 so as to maintain the vertical status of the printed circuit board 40. At the same time, gold plated contact surfaces 40a are placed in physical contact with the exterior circumferential surfaces of grindstones 21 of cleaning unit 20 that are held in positions on both sides of the printed circuit board guide 10 while maintained with a fixed pressure between grindstones 21 and contact surfaces 40a. When the printed circuit board 40 moves forward, grindstones 21 rotate in contact with gold plated contact surfaces 40a. When the printed circuit board 40 moves backward, grindstones 21 are stopped by the interaction of ratchet 22 with the detent 22a as is illustrated by FIG. 11. This causes friction between gold plated contact surfaces 40a and grindstones 21. This friction removes the contaminants that are borne by the gold plated contact surfaces 40a.

In other words, during forward movement of printed circuit board 40, grindstones 21 rotate coincidentally without friction and during backward movement of printed circuit board 40 along guide 11, rotation of grindstones 21 is stopped by interaction of ratchet 22 and detent 22a, thereby creating friction. Repetition of this reciprocating forward and backward movement makes it possible to clean the gold plated contact surfaces 40a by the creation of friction between grindstones 21 and contact surfaces 40a.

When grindstones 21 have been worn away through repetitiously frictionizing the gold plated contact surfaces 40a, the location of the grindstone 21 may be readjusted by virtue of first and second space adjustment screws 31a, 31b to be positioned in contact with gold plated contact s surfaces 40a. The pressure applied by grindstones 21 to the gold plated contact surfaces 40a may also be readjusted by the tension adjustment screw 31c which enables the spring to press the bracket 23a.

While the space adjustment means 31 position the grindstones 21 to be in contact with the gold plated contact surfaces 40a in a fixed pressure the space adjustment means 31 permit the grindstones 21 remove contaminants from gold plated contact surfaces 40a without damage to gold plated contact surfaces 40a. The apparatus is able to clean gold plated contact surfaces 40a and thereby remove contaminants from the gold plated contact surfaces through the application of friction by engaging contact surfaces 40a with grindstones 21, and provides uniformity of cleaning, thereby reducing the rate of failure of products using these circuit boards. Moreover the apparatus may be modified to enhance the cleaning capability by adding a plurality of cleaning units on both sides of the printed circuit board guide.

As aforementioned, the present invention provides an apparatus which enables operators to easily clean the gold plated contact surfaces and permits cleaning uniformity. This result in reducing the failure rate of products and enhancing the quality of products. The effective operation of the invention provides extra time to the operator who have previously been involved in an manual erasing operation. With this extra time the operator may carry out other operations at the same time and the operation efficiency is improved. Furthermore, the practice of this invention also provides an improved operating condition without ancillary adverse facts such as those attributable to the presence of waste particles generated by manual application of erasers.

What is claimed is:

1. An apparatus to clean gold plated contact surfaces of printed circuit boards, comprising:

a printed circuit board guide comprising a guide rail to guide the printed circuit boards;

a least one cleaning unit to remove contaminants from the gold plated contact surfaces through friction of the cleaning unit and the gold plated contact surfaces relative to the movements of the printed circuit boards on the length of the guide rail; and a base to support and fix the cleaning unit and the printed circuit board guide.

2. The apparatus of claim 1, wherein the cleaning unit comprises a set of:

a first cleaning unit on one side of the printed circuit board; and a second cleaning unit on the other side of the printed circuit board to be opposed to the first cleaning unit.

3. The apparatus of claim 1, wherein the cleaning unit comprises a plurality of sets of:

a first cleaning unit on one side of the printed circuit board; and a second cleaning unit on the other side of the printed circuit board oriented to face said first cleaning unit.

4. The apparatus of claim 1, wherein the cleaning unit comprises:
- a cylindrical grindstone in contact with the gold plated contact surfaces;
- a shaft to fix the grindstone;
- a ratchet fixed in the shaft to prevent the grindstone from reversely rotating so that the contaminants on the gold plated contact surfaces are removed, in the manner of that when the golden plate moves to a direction on the length of the guide rail the grindstone coincidentally rotates, while when the golden plate moves to the opposite direction on the length of the guide rail, the grindstone stopped by the rachet occurs friction; and
- a support frame to hold the shaft.

5. The apparatus of claim 1, wherein the base comprises a space adjustment means therein to adjust the space between the cleaning unit and the printed circuit board.

6. The apparatus of claim 5, wherein the space adjustment means comprises:
- a first space adjustment screw inserted through one end of the base to broaden the space between the cleaning unit and the printed circuit board; and
- a second space adjustment screw inserted through the other end of the base to narrow the space between the cleaning unit and the printed circuit board.

7. The apparatus of claim 5, wherein the base further comprises a tension adjustment means to determine the degree of the pressure to grind the golden plate.

8. The apparatus of claim 7, wherein the tension adjustment means comprises:
- a tension adjustment screw to adjust the pressure of the cleaning unit relative to the printed circuit board; and
- a spring to occur spring force on the cleaning unit by adjusting the tension adjustment screw.

9. The apparatus of claim 1, wherein the base further comprises a roller to maintain the vertical status of the printed circuit board on the printed circuit board guide rail and facilitate the smooth movements on the length of the guide rail of the printed circuit board.

10. An apparatus for clean contact surfaces of printed circuit boards, comprising:
- a base providing an elongated surface;
- a guide rail mounted to extend transversely across said elongated surface and guide printed circuit boards bearing a flat continuous array of electrical contact surfaces reciprocatingly travelling a along path across said elongated surface;
- first and second cleaning units mounted on said base on opposite sides of said guide rail, each of said first and second cleaning units comprising:
  - a cylindrical grindstone exposing an exterior circumferential surface having a width successively covering the contact surfaces;
  - a shaft mounted upon said base and positioning said grindstone to engage the contact surfaces as the circuit board reciprocates along said path;
  - a ratchet fixed in the shaft to accommodate rotation of said grindstone in a first rotary direction and to forestall rotation of said grindstone in a second and opposite rotary direction while the circuit boards move along said path; and
  - a support frame mounted upon said base to hold the shaft; and
- adjustment means engaging said support frame for one of said first and second cleaning units, for varying separation between said grindstone of said first cleaning unit and said grindstone of said second cleaning unit.

11. The apparatus of claim 10, comprised of said grindstone of said ratchet of said first said cleaning unit accommodating rotation of said grindstone for said first cleaning unit in said first direction while said ratchet of said second said cleaning unit accommodates rotation of said grindstone of said second cleaning unit in counter-rotation to said grindstone for said first cleaning unit.

12. The apparatus of claim 10, wherein said adjustment means comprises:
- a first space adjustment screw inserted through one end of the base to broaden the space between the cleaning unit and the printed circuit board; and
- a second space adjustment screw inserted through the other end of the base to narrow the space between the cleaning unit and the printed circuit board.

* * * * *